(12) United States Patent
Niiro

(10) Patent No.: US 6,744,683 B2
(45) Date of Patent: Jun. 1, 2004

(54) SEMICONDUCTOR DEVICE REMOVING DISCONNECTION DEFECT IN FUSE ELEMENT OF ITS PROGRAM CIRCUIT TO STABLY PERFORM COINCIDENCE COMPARISON OPERATION

(75) Inventor: Mitsutaka Niiro, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/309,883

(22) Filed: Dec. 5, 2002

(65) Prior Publication Data

US 2003/0223260 A1 Dec. 4, 2003

(30) Foreign Application Priority Data

Jun. 3, 2002  (JP) ........................................ 2002-161623

(51) Int. Cl.[7] ............................................... G11C 7/00
(52) U.S. Cl. ....................................... 365/201; 365/200
(58) Field of Search ................................. 365/201, 200, 365/230.06, 96

(56) References Cited

U.S. PATENT DOCUMENTS

| 5,933,382 A | * | 8/1999 | Yi et al. ................... 365/225.7 |
| 5,995,422 A | * | 11/1999 | Im et al. ...................... 365/200 |
| 5,999,463 A | * | 12/1999 | Park et al. ................... 365/200 |
| 6,252,809 B1 | * | 6/2001 | Kim ............................ 365/200 |
| 6,600,686 B2 | * | 7/2003 | Huh et al. ................... 365/201 |

FOREIGN PATENT DOCUMENTS

| JP | 04-290458 | 10/1992 |
| JP | 11-203888 | 7/1999 |

* cited by examiner

*Primary Examiner*—Anh Phung
(74) *Attorney, Agent, or Firm*—McDermott, Will & Emery

(57) ABSTRACT

Switching is made between applied voltages to fuse elements H1 to H4 in a program circuit 200 in response to a test signal /TE. To be concrete, in a test mode, a stepped-up voltage Vpp higher than a power supply voltage Vcc applied in the normal mode is applied to a fuse element to be disconnected to remove a disconnection defect left in the fuse element, thereby enabling perfect disconnection of the fuse element.

11 Claims, 5 Drawing Sheets

SEMICONDUCTOR DEVICE REMOVING DISCONNECTION DEFECT IN FUSE ELEMENT OF ITS PROGRAM CIRCUIT TO STABLY PERFORM COINCIDENCE COMPARISON OPERATION

BACKGROUND OF THE INVENTION

1. Field of the Invention

The present invention relates to a semiconductor device, and more particularly to a circuit configuration of a program circuit programming specific information in a non-volatile fashion.

2. Description of the Background Art

In a memory device, if a defect is caused in a circuit of a memory cell array, the defective circuit is replaced with a redundant circuit provided in advance on a chip.

As such a defect saving method, a method has been adopted in which at least one of a spare row and a spare column is provided in a memory cell array and a memory cell that has become defective due to a defect caused therein is replaced with a spare memory cell on a column to column or row to row basis, each as a replacement unit.

In this method, a necessity arises for, when an address at which a defective memory cell is selected is inputted, the defect address is switched to an address of a spare memory cell. For example, for performing the switching, defect address information, which is an address of a defective memory cell, is in advance programmed using a program circuit in a nonvolatile fashion to perform coincidence comparison of the defect address with an inputted address and according to a result of the comparison, a spare memory cell can be accessed.

Examples of such a method to program defect information include (1) an electric fuse method in which a high voltage is applied externally to blow a fuse, and (2) a method in which a fuse is blown by a laser beam illumination. In recent years, the second method has been widely used as a general method since a fuse and a program circuit thereof are easy in layout, and large in design flexibility, thereby realizing a low cost.

FIGS. 5A to 5C are conceptual diagrams showing the method in which a fuse is blown by a laser beam illumination.

Referring to FIG. 5A, here is shown a method in which a fuse 121, made of wiring material such as aluminum, polysilicon and copper (Cu), and having a width of the order of 1 $\mu$m and a length of 10 $\mu$m is illuminated with laser light so as to cover a region 120 having a width larger than the fuse 121, thereby disconnecting the fuse 121. Note that hereinafter this method is also referred to as a laser trimming method.

According to the method, as shown in FIG. 5B, a fuse is illuminated by a laser to selectively disconnect it and to thereby program defect address information. In a case where a fuse is blown according to the laser trimming method, an energy dose of a laser beam is optimized, a shift of the laser beam spot from a target is controlled and other techniques are applied for sure disconnection of the fuse. In a mass production process, however, there arises a situation where a disconnection defect, that is a small connected portion, left in a fuse after fuse disconnection (hereinafter also referred to as "micro-short") generates in a circuit.

FIG. 5C is a conceptual diagram showing the micro-short. When such a disconnection defect is present, a small leakage current flows in a program circuit, leading to a possibility of inconvenience that a normal memory cell and a spare memory cell are simultaneously selected in a memory device.

SUMMARY OF THE INVENTION

The present invention has been made in order to solve the problem as described above and it is an object of the present invention to provide a semiconductor device capable of removing disconnection defect due to micro-short to stably perform a coincidence comparison operation.

A semiconductor device according to an aspect of the present invention includes a plurality of internal circuits and a program circuit. The program circuit stores prescribed information required in at least one of the plurality of internal circuits in a non-volatile fashion and performs coincidence comparison between the prescribed information and input information in a normal operation. The program circuit includes a plurality of program elements, an internal node, a voltage supply switch circuit and a select circuit. The plurality of program elements each transitions from its electrically conductive state to its electrically non-conductive state in response to an external input corresponding to the prescribed information. A signal indicating a result of the coincidence comparison is generated at the internal node. The voltage supply switch circuit supplies, to the internal node, one of a first voltage commonly used by at least one of the plurality of internal circuits and a second voltage different from the first voltage. The select circuit connects electrically at least one selected according to the input information among the plurality of program elements between the internal node and a fixed voltage. The voltage supply switch circuit supplies the internal node with that one of the first and second voltages, which is smaller in potential difference from the fixed voltage than the other in the normal operation, while coupling the internal node with the other of the first and second voltages which is larger in potential difference from the fixed voltage than the one in an operation test.

That is, in a semiconductor device of the present invention, the select circuit in the program circuit connects electrically at least one selected among the plurality of program elements between the internal node and the fixed voltage. The voltage supply switch circuit supplies the internal node with the first or second voltage which is smaller in potential difference from the fixed voltage than the other in the normal operation, while supplying the internal node with the first or second voltage which is larger in potential difference from the fixed voltage than the other in an operation test.

With such a configuration adopted, a main advantage of a semiconductor device of the present invention is that in an operation test, an electric field higher than in the normal operation can be applied to at least one of the plurality of program elements. That is, a disconnection defect in a program element can be removed to achieve perfect disconnection, thereby enabling stable execution of a coincidence comparison operation in the program circuit.

A semiconductor device according to another aspect of the present invention includes a plurality of internal circuits and a program circuit. The program circuit stores prescribed information required in at least one of the plurality of internal circuits in a non-volatile fashion and performs coincidence comparison between the prescribed information and input information in the normal operation. The program circuit includes a plurality of program elements, an internal node, a select circuit and a test voltage supply switch circuit. The plurality of program elements each transitions from its electrically conductive state to its electrically non-conductive state in response to an external input corresponding to the prescribed information. The internal node is coupled to a first voltage commonly used by at least one of the plurality of internal circuits to indicate a result of the coincidence comparison in the normal operation. The select circuit, in the normal operation, connects electrically at least one selected according to the input information among the plurality of program elements between the internal node and a fixed voltage. The test voltage supply switch circuit, in an operation test, connects electrically each of the plurality of program elements regardless of the input information between a second voltage that is commonly used by at least one of the plurality of internal circuits and a fixed voltage. A potential difference between the second voltage and the fixed voltage is larger than a potential difference between the first voltage and the fixed voltage.

That is, in a semiconductor device of the present invention, the select circuit in the program circuit connects electrically at least one selected among the plurality of program elements between the internal node and the fixed voltage. The test voltage supply switch circuit, in an operation test, connects electrically each of the plurality of program elements to the second voltage larger in potential difference from the fixed voltage than the first voltage.

Therefore, an advantage of a semiconductor device of the present invention is that, in an operation test, an electric field higher than in the normal operation can be applied to the plurality of program elements. That is, a disconnection defect in a program element can be removed to achieve perfect disconnection, thereby enabling stable execution of a coincidence comparison operation of the program circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention below with reference to the accompanying drawings. Note that the same symbols indicate the same or corresponding components.
First Embodiment In the following embodiment, description will be given of a configuration of a semiconductor memory device as a representative of semiconductor devices. To be concrete, there is shown a semiconductor memory device including a program circuit therein.

Figure 1:
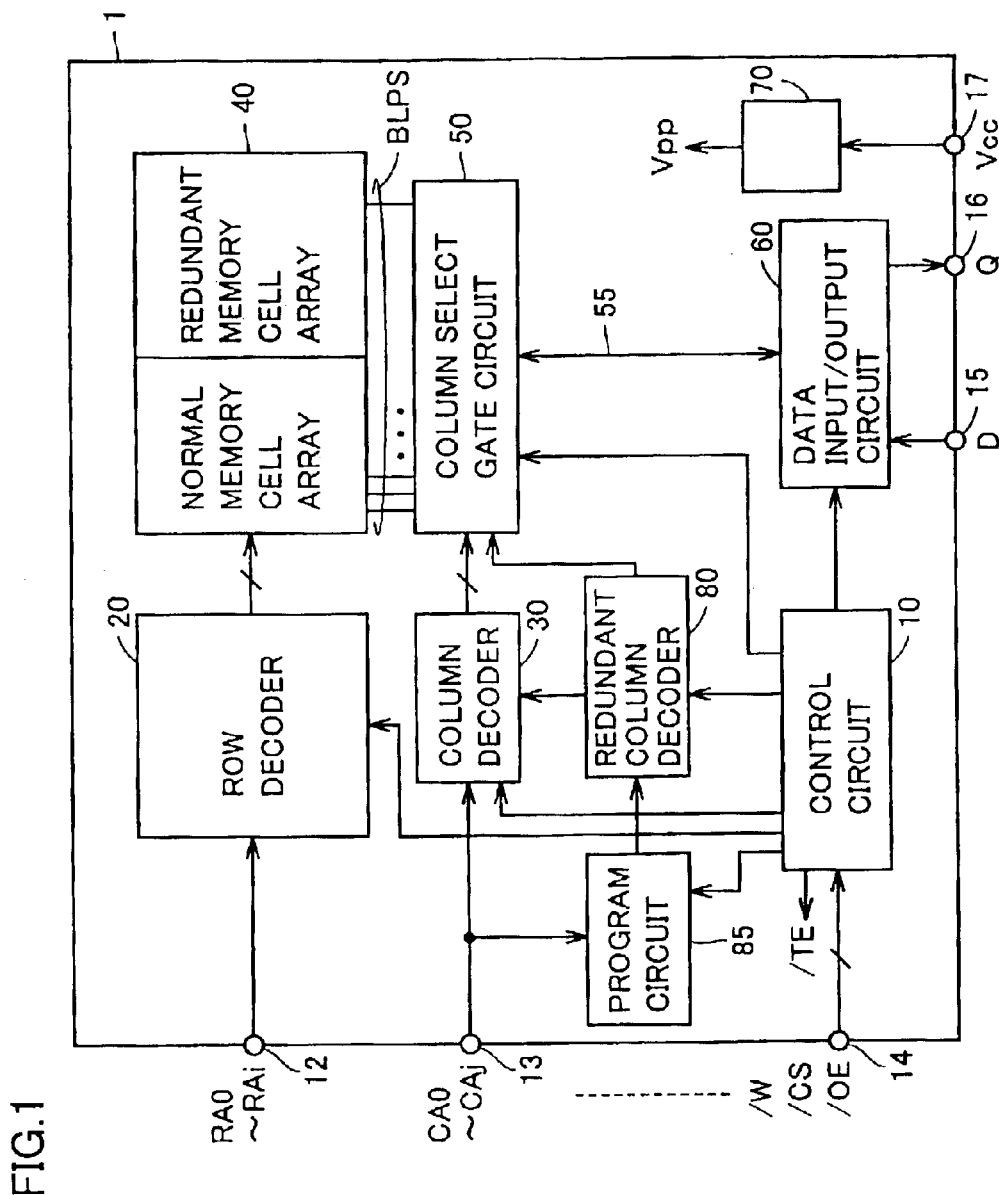
FIG. 1 is a diagram showing an overall configuration of a semiconductor memory device of the present invention.

Referring to FIG. 1, a semiconductor memory device 1 according to embodiments of the present invention includes: a row address terminal 12 receiving a row address signal RA0 to RAi (i is a natural number); a column address terminal 13 receiving a column address signal CA0 to CAj (is a natural number); a control signal terminal 14 receiving control signals such as a read/write control signal /W, a chip select signal /CS, an output enable signal /OE and others; a data input terminal 15 receiving input data D; a data output terminal 16 outputting output data Q; and a power supply terminal 17 receiving a power supply voltage Vcc (for example, 3.3 V). Note that a symbol "/" prefixed to a symbol indicates inversion, negation, complement or the like of or to the latter or letters, which will be applied in later parts of the description.

In response to the above mentioned control signals, semiconductor memory device 1 includes: a control circuit 10 controlling internal operations in semiconductor memory device 1; a memory cell array 40 having a plurality of memory cells arranged in rows and columns therein; a row decoder 20 decoding row address signal RA0 to RAi to select a memory cell row; a column decoder 30 decoding column address signal CA0 to CAj to select a memory cell column; a column select gate circuit 50 coupling one of a bit line pair group BLPs provided correspondingly to respective memory cell columns to a data I/O line 55 on the basis of a result of column selection of column decoder 30; a data input/output circuit 60 performing supply/receipt of data between data I/O line 55 and each of data input terminal 15 and data output terminal 16; and a step-up circuit 70 stepping up power supply voltage Vcc from power supply terminal 17 to supply a stepped-up voltage Vpp (for example, on the order of 1.5 times as high as 3.3 V) to internal circuits. Memory cell array 40 includes: a normal memory cell array constituted of normal memory cells; and a redundant memory cell array constituted of redundant memory cells for saving a normal memory cell in which a defect has caused (hereinafter also referred to "defective memory cell"). A redundant memory cell array has redundant memory cell columns each constituted of redundant memory cells.

Semiconductor memory device 1 further includes: a redundant column decoder 80; and a program circuit 85.

Program circuit 85 not only stores prescribed information in a non-volatile fashion but also performs coincidence comparison between the prescribed information and input information inputted externally to output a result of coincidence comparison to redundant column decoder 80. To be concrete, program circuit 85 stores address information of a defective memory cell as prescribed information in a non-volatile fashion and executes coincidence comparison between the prescribed information and a column address signal inputted externally. In this embodiment, description will be given below of a configuration in which address information to specify a defective memory cell is stored as programmed information in program circuit 85. The address information corresponds to a column address indicating a memory cell column on which a defective memory cell exists.

When a defective memory cell is selected according to a result of coincidence comparison, which is an output result of program circuit 85, redundant column decoder 80 not only causes column decoder 30 to cease a column select operation according to a column address, but also instructs it to make an access to a redundant memory cell column which saves a defective memory cell.

Figure 2:
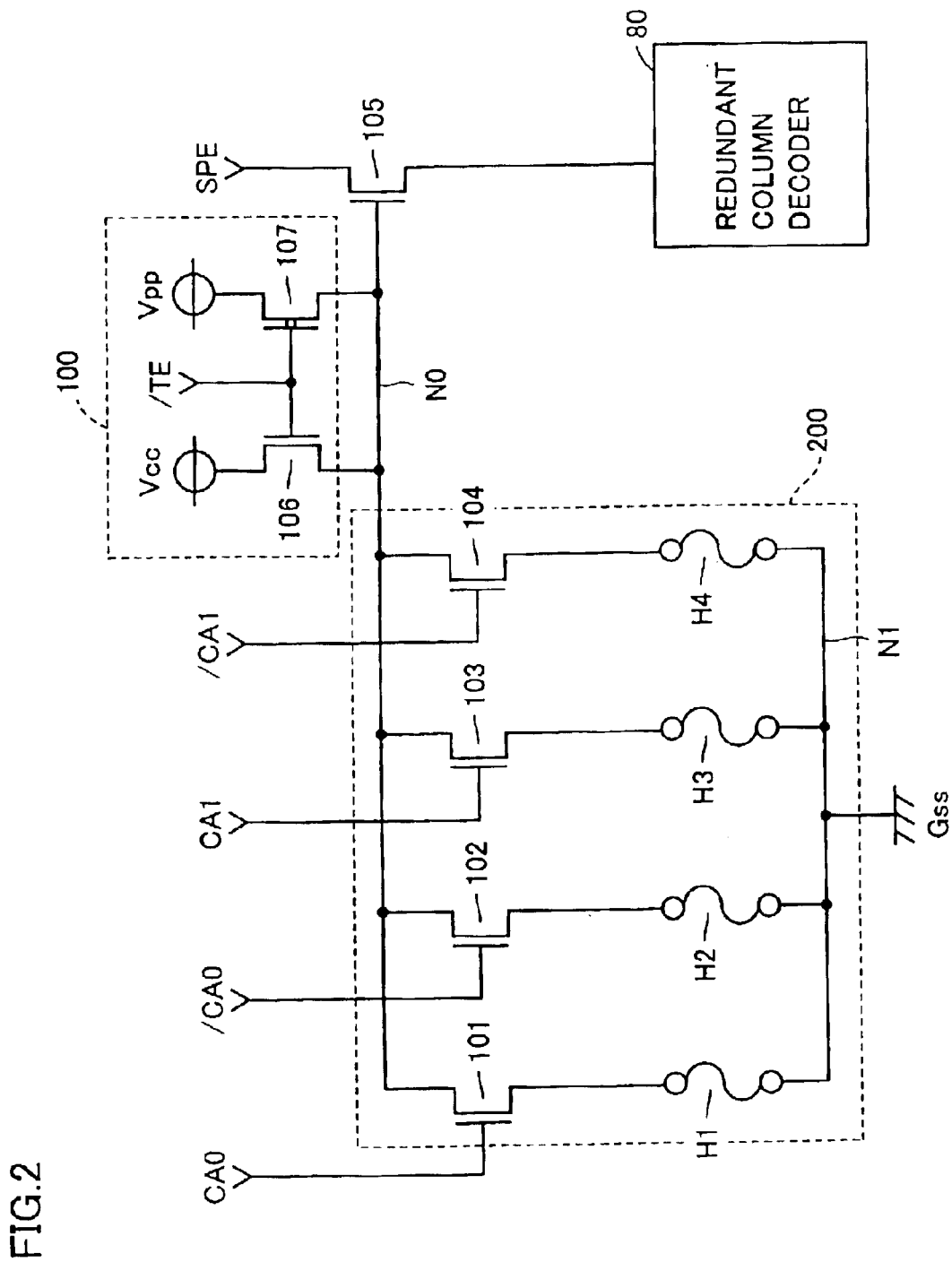
FIG. 2 is a diagram showing a configuration of a program circuit according to a first embodiment of the present invention.

Referring to FIG. 2, a program circuit according to the first embodiment of the present invention receives 2 bit column address signals CA0 (/CA0) and CA1 (/CA1) to executes a coincidence comparison operation with a preset address of a defective memory cell A redundant select signal SPE is outputted to redundant column decoder 80 on the basis of a result of the coincidence comparison. Note that redundant select signal SPE is outputted from control circuit 10 and set at "H" level in the normal operation.

A program circuit according to the first embodiment of the present invention includes: a voltage supply switch circuit 100 switching between voltages to be supplied to a node N0; a program setting circuit 200 connected to node N0, and for setting a defect address of a defective memory cell in a non-volatile fashion; and a transistor 105 whose gate is connected to node N0, and transmitting redundant select signal SPE (at "H" level) according to a voltage level at node N0 to redundant column decoder 80. Note that transistor 105 is an N-channel MOS transistor high in gate withstand voltage.

Voltage supply switch circuit 100 includes transistors 106 and 107. Transistor 106 couples power supply voltage Vcc to node N0 in response to an input of test signal /TE (at "H" level). Transistor 107 couples stepped-up voltage Vpp to node N0 in response to an input of test signal /TE (at "L" level). Voltage supply switch circuit 100 selectively couples node N0 to one of power supply voltage Vcc and stepped-up voltage Vpp in response to a voltage level of test signal /TE. Herein, as an example, transistor 106 is an N-channel MOS transistor and transistor 107 is a P-channel MOS transistor. Note that test signal /TE is outputted from a test signal generating circuit included in control circuit 10, which is not shown.

Program setting circuit 200 sets address information of a defective memory cell in a non-volatile fashion on the basis of disconnection of a fuse. Program setting circuit 200 includes transistors 101 to 104 and fuses H1 to H4. Herein, as an example, transistors 101 to 104 are N-channel MOS transistors.

Transistors 101 to 104 are arranged in parallel to each other correspondingly to respective inputted column address signals CA0 (/CA0) to CA1 (/CA1) and couple node N0 to a fuse in response to an input of a corresponding column address signal. Fuses H1 to H4 are disposed in parallel between node N0 and a node N1 coupled electrically to ground voltage Gss through respective transistors 101 to 104.

Description will be given here of the normal operation in a program circuit according to the first embodiment of the present invention. Note that redundant select signal SPE is set at "H" level.

For example, it is assumed that, in program setting circuit 200, fuses H2 and H3 have been disconnected in advance correspondingly to respective column addresses of defective memory cells using the laser trimming method.

Herein, memory cells other than a defective memory cell are access objects and, for example, when column addresses CA0 and CA1 (both at "H" level) are inputted, transistors 101 and 103 are turned on. The other transistors 102 and 104 are in off state.

While fuse H3 corresponding to transistor 103 has been disconnected in advance using the laser trimming method, fuse H1 corresponding to transistor 101 is not disconnected, so a current path occurs between node N0 and N1. In company with this, a voltage level at node N0 is set to "L" level. Then, since transistor 105 is in off state, redundant select signal SPE (at "H" level) is not transmitted to redundant column decoder 80. Therefore, there arises no replacement with a redundant memory cell column. In this situation, an access is made to a memory cell according to the column address signal in a normal select operation by column decoder 30.

On the other hand, for example, when column address signals/CA0 and CA1 (both at "H" level) are inputted wherein a defective memory cell is an access object, transistors 102 and 103 are turned on. The other transistors 101 and 104 are in off state.

In this case, since fuse H2 corresponding to transistor 102 and fuse H3 corresponding to transistor 103 have been disconnected in advance using the laser trimming method, no current path arises between node N0 and node N1. In company with this, a voltage level at node N0 is set to a voltage level of power supply voltage Vcc, that is "H" level. Then, transistor 105 is turned on, redundant select signal SPE (at "H" level) is transmitted to redundant decoder 80 and a redundant memory cell column for saving a defective memory cell is accessed in response to an input of an address of the defective memory cell.

However, in a case where, in laser disconnection, micro-short arises in a fuse for the fuse has not been completely disconnected with a small connected portion left, as described above, a possibility arises that the fuse is regarded as being conductive, leading to failure in desired replacement. Furthermore, similar to this, there is another case where, though this is caused according to an extent of micro-short, a fuse was regarded as being non-conductive at a first time and then at a second time, the fuse is electrically connected because of changes over time after package and shipping, for example thermal expansion of wiring caused by temperature rise due to external heat or internal heat and others, and in the case, a possibility arises that such a micro-short causes a failure in column select operation.

In a test, a test signal /TE transitioning from "H" level to "L" level is inputted to a program circuit according to the first embodiment. In response to this, voltage supply switch circuit 100 switches from electrical connection between node N0 and power supply voltage Vcc to electrical connection between node N0 and stepped-up voltage Vpp. For example, in the test operation, when column address signals CA0 and CA1 (both at "H" level) are inputted, transistors 101 and 103 are turned on. Thereby, a high electric field by stepped-up voltage Vpp is applied to fuses H1 and H3 corresponding to transistors 101 and 103. With application of the high electric field by stepped-up voltage Vpp to fuses H1 and H3, a fuse in a micro-short state can perfectly reach a non-conductive state. Note that redundant select signal SPE is set at "L" level in a test operation.

Furthermore, when column address signals/CA0 and /CA1 (both at "H" level) are inputted, transistors 102 and 104 are turned on. Thereby, fuses H2 and H4 corresponding to transistors 102 and 104 are applied with a high electric field by stepped-up voltage Vpp and a fuse in a micro-short state can become perfectly non-conductive in a similar way. Note that by fixing column address signals CA0, /CA0, CA1 and /CA1 all at "H" level in a test, it is possible to apply a high electric field caused by stepped-up voltage Vpp to all of fuses H1 to H4 and to thereby cause a fuse in a micro-short state to be in a perfectly non-conductive state.

With such a configuration, a coincidence comparison operation can be more stably executed in a program circuit by causing a fuse in a micro-short state to be in a perfectly non-conductive state during a test. Therefore, with such a more stable coincidence operation realized, a defective memory cell can be saved by replacement on the basis of a select instruction in redundant column decoder 80.

Second Embodiment

Figure 3:
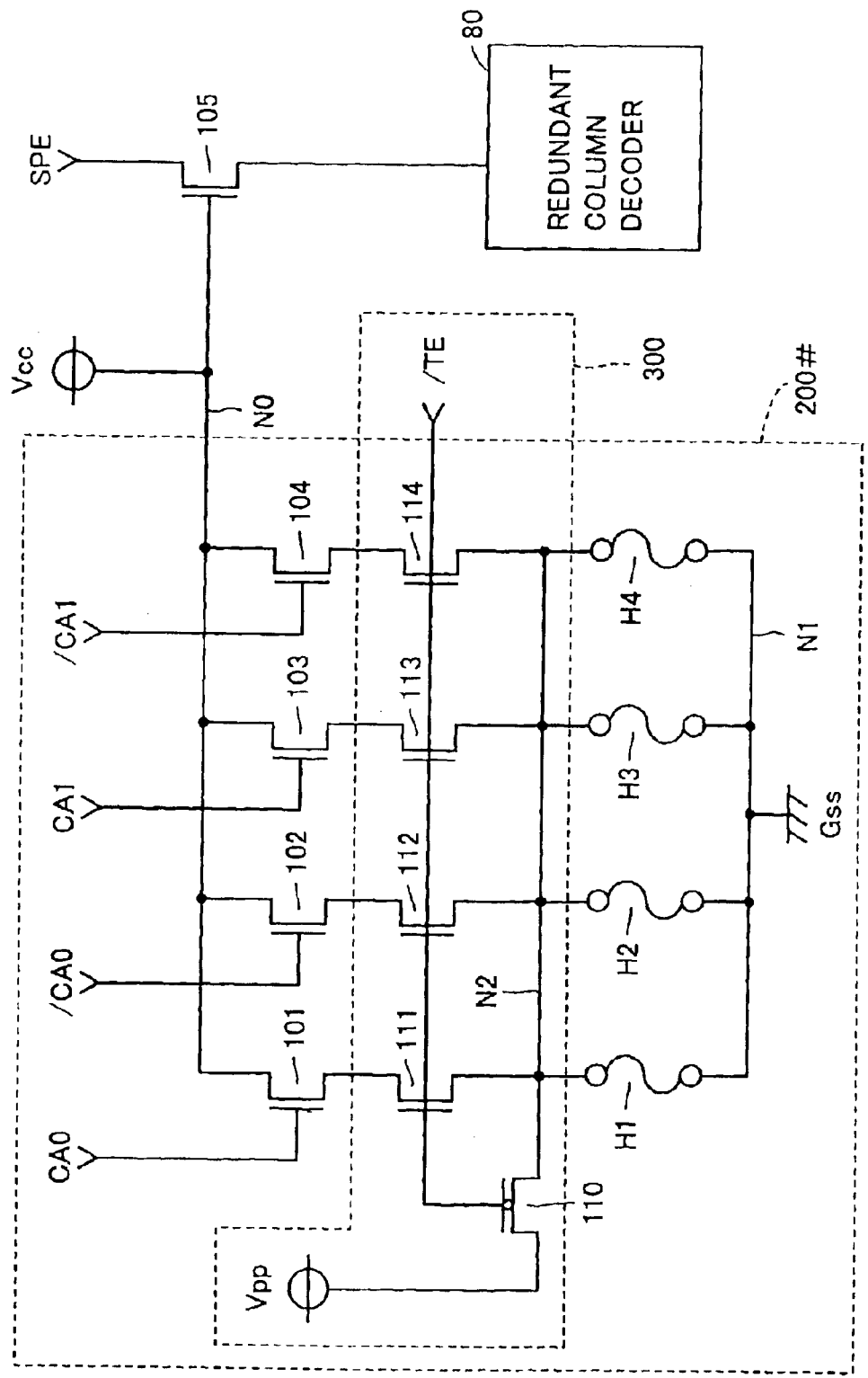
FIG. 3 is a diagram showing a configuration of a program circuit according to a second embodiment of the present invention.

Referring to FIG. 3, according to the second embodiment of the present invention, the program circuit is different from the program circuit of FIG. 2 in comparison therewith in that program setting circuit 200 is replaced with a program setting circuit 200# and in that node N0 and power supply voltage Vcc are electrically connected directly to each other, removing voltage supply switch circuit 100. Since the other parts of the configuration are similar to corresponding parts of the configuration of the program circuit of FIG. 2, none of detailed descriptions thereof will be repeated.

Program circuit 200# is different from program setting circuit 200 in that test voltage supply switch circuit 300 is further included in program circuit 200#.

Test voltage supply switch circuit 300, in a test, not only causes transistors 101 to 104 not to be electrically coupled with respective corresponding fuses H1 to H4, but also electrically couples fuses H1 to H4 to stepped-up voltage Vpp.

Test voltage supply switch circuit 300 includes transistors 110 to 114. Transistor 110 is disposed between stepped-up voltage Vpp and a node N2 and receives test signal /TE at the gate thereof. Transistors 111 to 114 are disposed between node N2 and respective transistors 101 to 104 and receive test signal /TE at the gates thereof. As an example, herein, transistors 111 to 114 are N-channel MOS transistors and transistor 110 is a P-channel MOS transistor.

In a program circuit according to the second embodiment of the present invention, in the normal operation, transistors 111 to 114 are turned on by an input of test signal /TE (at "H" level) to couple electrically corresponding transistors and fuses to each other. Then, since the configuration in the normal operation is similar to the configuration described in the first embodiment, no detailed description thereof will be repeated.

In a test, test voltage supply switch circuit 300 causes all of transistors 111 to 114 to be turned off in response to an input of test signal /TE (at "L" level). Furthermore, transistor 110 is turned on to couple electrically stepped-up voltage Vpp and node N2 to each other. Thereby, a high electric field can be applied to fuses H1 to H4 to thereby cause a fuse in a micro-short state to be in a perfectly non-conductive state.

Since transistors 111 to 114 are all turned off, no electric coupling generates between stepped-up voltage Vpp and node N0. Therefore, there is no chance to apply a high electric field to node N0 and while, in the first embodiment, transistor 105 is one high in gate withstand voltage, a transistor having a withstand voltage similar to the other transistors can be used in this configuration.

In the program circuit of the second embodiment of the present invention, fuses H1 to H4 can be electrically connected directly to stepped-up voltage Vpp. Therefore, a high electric field by stepped-up voltage Vpp can be applied to fuses connected in parallel to each other without respect to an input of column address signal CA, thereby enabling more efficiently causing a fuse in a micro-short state to be perfectly non-conductive than in the first embodiment.

Third Embodiment

While, in the above embodiment, description is given of the configuration of the program circuit, description in the third embodiment will be given of a test signal generating circuit generating test signal /TE inputted to the above program circuit.

Figure 4:
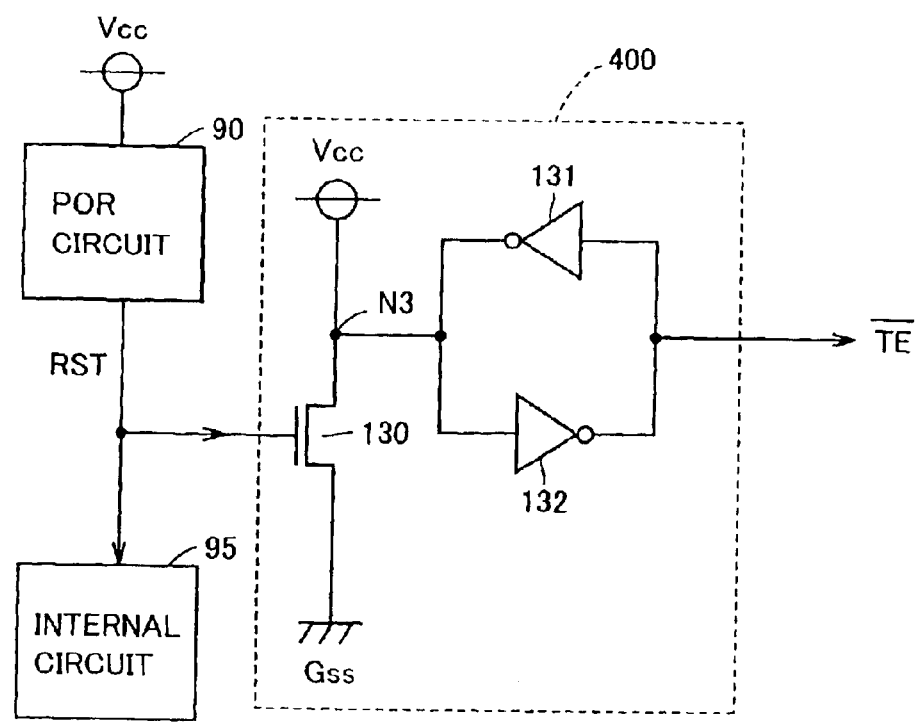
FIG. 4 is a conceptual diagram of a test signal generating circuit and peripheral circuitry according to a third embodiment of the present invention.
Figure 5A:
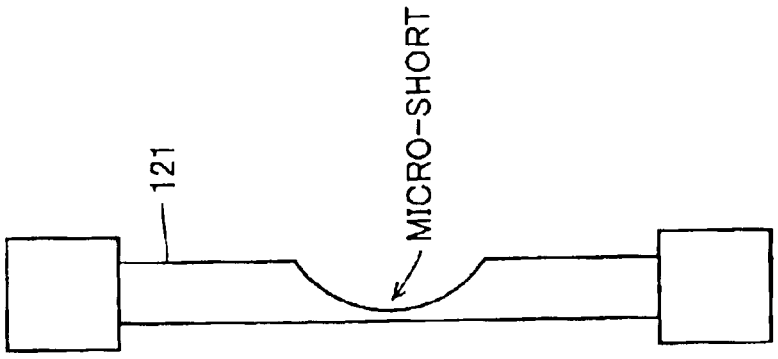
FIGS. 5A to 5C are conceptual diagrams showing a method in which a fuse is blown by a laser beam illumination.
Figure 5B:
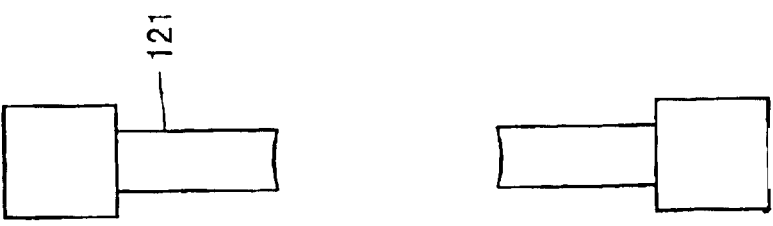
Figure 5C:
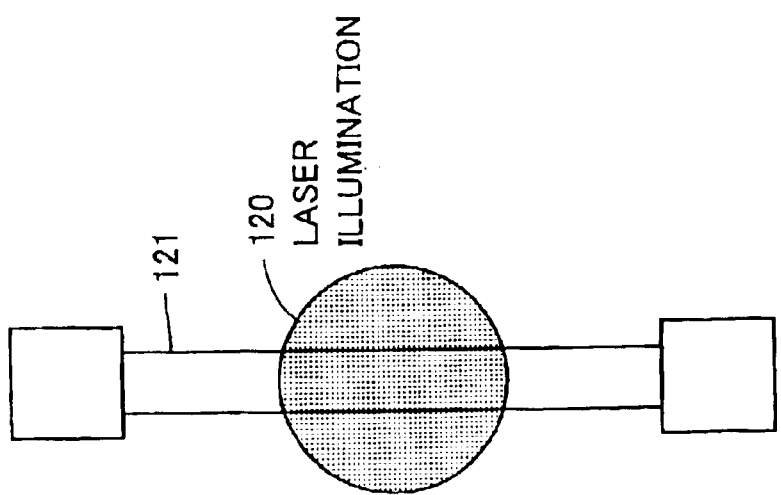

Referring to FIG. 4, a test signal generating circuit according to the third embodiment of the present invention includes: a power-on reset circuit 90 hereinafter also referred to as POR circuit 90) outputting a reset signal RST for resetting an internal circuit 95 on turning-on of power supply voltage; and a test signal outputting circuit 400 receiving an input of reset signal RST to output a test signal /TE.

POR circuit 90 sets reset signal RST at "L" level till power supply voltage Vcc rises to a prescribed voltage (a threshold voltage) from 0 V. Reset signal RST is set to "H" level when power supply voltage Vcc exceeds the prescribed voltage. In a period when reset signal RST is at "L" level, initialization is performed of internal circuits in a semiconductor integrated circuit device, to be concrete various kinds of registers or various kinds of state machines of a memory device.

Test signal outputting circuit 400 includes transistor 130, and inverters 131 and 132. Transistor 130 is disposed between a node N3 coupled electrically to power supply voltage Vcc and ground voltage Gss and receives an input of reset signal RST at the gate thereof. Inverter 132 outputs an inverted signal of a signal transmitted to node N3 as test signal /TE. Inverter 131 receives and inverts an output signal of inverter 132 to transmit the inverted signal to node N3. That is, a so-called latch circuit is constituted of inverters 131 and 132.

As described above, reset signal RST, which is an output signal of POR circuit 90, is set to "L" level on power on. Therefore, reset signal RST at "L" level is inputted not only to internal circuit 95, but also to test signal outputting circuit 400.

Test signal output circuit 400 receives an input of reset signal RST (at "L" level) at the gate of transistor 130, but the transistor 130 is not turned on. Therefore, a voltage level of node N3 is set to a voltage level of power supply voltage Vcc, that is "H" level. Therefore, the so-called latch circuit is driven according to a voltage level at node N3 to set test signal /TE to "L" level.

In response to an input of test signal /TE (at "L" level), in redundant column decoder, as described above, stepped-up voltage Vpp is applied to fuses to enable a fuse in a micro-short state, if it is, to be perfectly non-conductive.

On the other hand, when power supply voltage Vcc exceeds a prescribed voltage after power is turned on, POR circuit 90 sets reset signal RST to "H" level. Then, transistor 130 is turned on to set a voltage level at node N3 to "L" level. Thereby, test signal output circuit 400 sets rest signal /TE to "H" level.

With the above procedures performed, a normal coincidence comparison operation is executed.

Note that, while, in this embodiment, description is given of the configuration of the program circuit used by a redundant column decoder in a semiconductor memory device, the program circuit of the present invention can be applied not only to a semiconductor memory device but also to other semiconductor devices.

While, in the configuration of the program circuit of the above embodiment, description is given of a configuration to which a 2 bit address signal is inputted, a configuration is not limited thereto, but there can be adopted a configuration to which three or more bit address signal is inputted. While, in this embodiment, description is given mainly of coincidence comparison between an input address signal and a defect address, no limitation is imposed only on coincidence comparison therebetween but coincidence comparison can be executed between an input address signal and another prescribed information.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a plurality of internal circuits; and
a program circuit storing prescribed information required in at least one of said plurality of internal circuits in a non-volatile fashion and performing coincidence comparison between said prescribed information and input information in a normal operation, wherein
said program circuit includes:
a plurality of program elements each capable of transitioning from its electrically conductive state to its electrically non-conductive state in response to an external input corresponding to said prescribed information;
an internal node at which a signal indicating a result of said coincidence comparison is generated;
a voltage supply switch circuit for supplying, to said internal node, one of a first voltage commonly used by at least one of said plurality of internal circuits and a second voltage different from said first voltage; and
a select circuit connecting electrically at least one selected according to said input information among said plurality of program elements between said internal node and a fixed voltage, wherein
said voltage supply switch circuit supplies said internal node with that one of said first and second voltages, which is smaller in potential difference from said fixed voltage than the other in said normal operation, while supplying said internal node with that one of said first and second voltages which is larger in potential difference from said fixed voltage than the one in an operation test.

2. The semiconductor device according to claim 1, wherein
said input information includes a plurality of signals corresponding to said plurality of program elements, respectively,
said select circuit includes a plurality of switch circuits each corresponding to said plurality of program elements, respectively, and
each of said switch circuits is connected in series with the corresponding program element between said fixed voltage and said internal node and connects said corresponding program element electrically between said internal node and said fixed voltage in response to the corresponding signal.

3. The semiconductor device according to claim 1, wherein
said voltage supply switch circuit includes:
a first switch circuit disposed between said internal node and said first voltage, and turning on in response to a test signal; and
a second switch circuit disposed between said internal node and said second voltage, and turning on complementarily to said first switch circuit in response to said test signal.

4. The semiconductor device according to claim 3, further comprising:
a test signal generating circuit for outputting said test signal for a prescribed period upon turning-on of power supply voltage.

5. The semiconductor device according to claim 1, wherein
a potential difference between said second voltage applied to each of said program elements and said fixed voltage is larger than a potential difference between said first voltage and said fixed voltage, but smaller than a potential difference between a third voltage required for causing each of said program elements to transition from said electrically conductive state to said electrically non-conductive state, and said fixed voltage.

6. A semiconductor device comprising:
a plurality of internal circuits; and
a program circuit storing prescribed information required in at least one of said plurality of internal circuits in a non-volatile fashion and performing coincidence comparison between said prescribed information and input information in a normal operation, wherein normal operation, wherein
said program circuit includes:
a plurality of program elements each capable of transitioning from its electrically conductive state to its electrically non-conductive state in response to an external input corresponding to said prescribed information;
an internal node coupled to a first voltage commonly used by at least one of said plurality of internal circuits to indicate a result of said coincidence comparison in said normal operation;
a select circuit, in said normal operation, for connecting electrically at least one selected according to said input information among said plurality of program elements between said internal node and a fixed voltage; and
a test voltage supply switch circuit, in an operation test, for connecting electrically each of said plurality of program elements regardless of said input information between a second voltage that is commonly used by at least one of said plurality of internal circuits and said fixed voltage, and
a potential difference between said second voltage and said fixed voltage is larger than a potential difference between said first voltage and said fixed voltage.

7. The semiconductor device according to claim 6, wherein
a potential difference between said second voltage applied to each of said program elements and said fixed voltage is smaller than a potential difference between a third voltage and said fixed voltage, wherein said potential difference between said third voltage and said fixed voltage causes each of said program elements to transition from said electrically conductive state to said electrically non-conductive state.

8. The semiconductor device according to claim 6, wherein
said test voltage supply switch circuit cuts said plurality of program elements off electrically from said select circuit in response to a test signal in said operation test.

9. The semiconductor device according to claim 8, wherein
said test voltage supply switch circuit includes
a plurality of switch circuits provided corresponding to said plurality of program elements, respectively, each disposed between corresponding one of said plurality of program elements and said select circuit, and each of said switch circuits cuts respective corresponding program elements off electrically from said select circuit in response to said test signal.

10. The semiconductor device according to claim 8, further comprising:

a test signal generating circuit for outputting said test signal for a prescribed period upon turning-on of power supply voltage.

11. The semiconductor device according to claim 10, wherein said test signal generating circuit includes:

a power-on reset circuit for generating a reset signal used in resetting each of said plurality of internal circuits in response to comparison between the power supply voltage and a threshold voltage upon said turning-on of power supply voltage; and a test signal outputting circuit outputting said test signal in response to a level of said reset signal.

* * * * *